United States Patent
Moschiano et al.

(10) Patent No.: US 9,620,236 B2
(45) Date of Patent: *Apr. 11, 2017

(54) LEVEL COMPENSATION IN MULTILEVEL MEMORY

(71) Applicant: Micron Technology, Inc., Boise, ID (US)

(72) Inventors: Violante Moschiano, Bacoli (IT); Walter Di Francesco, Silvi (IT)

(73) Assignee: Micron Technology, Inc., Boise, ID (US)

( * ) Notice: Subject to any disclaimer, the term of this patent is extended or adjusted under 35 U.S.C. 154(b) by 42 days.

This patent is subject to a terminal disclaimer.

(21) Appl. No.: 14/790,438

(22) Filed: Jul. 2, 2015

(65) Prior Publication Data

US 2015/0302931 A1   Oct. 22, 2015

Related U.S. Application Data

(60) Division of application No. 13/563,283, filed on Jul. 31, 2012, now Pat. No. 9,076,547, which is a
(Continued)

(51) Int. Cl.
*G11C 16/10* (2006.01)
*G11C 16/34* (2006.01)
*G11C 11/56* (2006.01)

(52) U.S. Cl.
CPC ...... *G11C 16/3427* (2013.01); *G11C 11/5628* (2013.01); *G11C 16/349* (2013.01); *G11C 16/3418* (2013.01); *G11C 16/3431* (2013.01)

(58) Field of Classification Search
CPC .......... G11C 16/10; G11C 16/12; G11C 16/30
(Continued)

(56) References Cited

U.S. PATENT DOCUMENTS

| | | |
|---|---|---|
| 5,508,958 A | 4/1996 | Fazio et al. |
| 5,867,429 A | 2/1999 | Chen et al. |

(Continued)

FOREIGN PATENT DOCUMENTS

| | | |
|---|---|---|
| CN | 101385089 A | 3/2009 |
| CN | 101405812 A | 4/2009 |

(Continued)

OTHER PUBLICATIONS

"European Application Serial No. 12828784.4, Extended European Search Report mailed Apr. 29, 2015", 8 pgs.
(Continued)

*Primary Examiner* — Son Dinh
(74) *Attorney, Agent, or Firm* — Schwegman Lundberg & Woessner, P.A.

(57) ABSTRACT

Some embodiments include apparatuses and methods having a compensation unit to provide a compensation value based at least in part on a threshold voltage value of a memory cell. At least one of such embodiments includes a controller to select a code during an operation of retrieving information from the memory cell to represent a value of information stored in the memory cell. Such a code can be associated with an address having an address value based at least in part on the compensation value. Additional apparatuses and methods are described.

21 Claims, 11 Drawing Sheets

Related U.S. Application Data continuation-in-part of application No. 13/219,439, filed on Aug. 26, 2011, now Pat. No. 9,030,870.

(60) Provisional application No. 61/620,636, filed on Apr. 5, 2012, provisional application No. 61/620,628, filed on Apr. 5, 2012.

(58) Field of Classification Search
USPC ............ 365/185.18, 185.19, 185.24, 185.25, 365/185.03
See application file for complete search history.

(56) References Cited

U.S. PATENT DOCUMENTS

| | | | |
|---|---|---|---|
| 6,154,157 A | 11/2000 | Wong | |
| 7,460,398 B1 * | 12/2008 | Roohparvar | G11C 11/5628 365/185.03 |
| 7,463,514 B1 | 12/2008 | Haque et al. | |
| 7,577,034 B2 | 8/2009 | Lee et al. | |
| 7,630,246 B2 * | 12/2009 | Roohparvar | G11C 11/5621 365/185.03 |
| 7,684,237 B2 | 3/2010 | Moschiano et al. | |
| 7,800,951 B2 | 9/2010 | Sutardja | |
| 7,936,599 B2 * | 5/2011 | Roohparvar | G11C 11/5628 365/185.02 |
| 7,944,754 B2 | 5/2011 | Cernea | |
| 8,116,141 B2 | 2/2012 | Yoo et al. | |
| 8,451,664 B2 | 5/2013 | Radke et al. | |
| 9,030,870 B2 | 5/2015 | Moschiano et al. | |
| 9,076,547 B2 * | 7/2015 | Moschiano | G11C 11/5628 |
| 9,087,594 B2 | 7/2015 | Moschiano et al. | |
| 2002/0110019 A1 | 8/2002 | Satoh et al. | |
| 2008/0253188 A1 | 10/2008 | Aritome | |
| 2008/0253193 A1 | 10/2008 | Cernea | |
| 2008/0273384 A1 | 11/2008 | Sarin et al. | |
| 2009/0073771 A1 | 3/2009 | Li | |
| 2009/0106482 A1 | 4/2009 | Sarin | |
| 2009/0141558 A1 | 6/2009 | Sarin et al. | |
| 2009/0290426 A1 | 11/2009 | Moschiano et al. | |
| 2010/0074026 A1 | 3/2010 | Kang | |
| 2010/0149868 A1 | 6/2010 | Yoo et al. | |
| 2010/0265764 A1 | 10/2010 | Yoo et al. | |
| 2010/0299475 A1 | 11/2010 | Yano | |
| 2010/0321995 A1 | 12/2010 | Sarin | |
| 2010/0321999 A1 | 12/2010 | Yoo et al. | |
| 2011/0141815 A1 | 6/2011 | Haratsch et al. | |
| 2013/0033937 A1 | 2/2013 | Aritome et al. | |
| 2013/0051141 A1 | 2/2013 | Moschiano et al. | |
| 2013/0058164 A1 | 3/2013 | Moschiano et al. | |
| 2013/0265827 A1 | 10/2013 | Moschiano et al. | |
| 2015/0243351 A1 | 8/2015 | Moschiano et al. | |
| 2015/0325309 A1 | 11/2015 | Moschiano et al. | |

FOREIGN PATENT DOCUMENTS

| | | |
|---|---|---|
| CN | 101458954 A | 6/2009 |
| CN | 101861624 A | 10/2010 |
| CN | 103843068 A | 6/2014 |
| JP | 2008536251 A | 9/2008 |
| JP | 2009545093 A | 12/2009 |
| JP | 2010541119 A | 12/2010 |
| TW | 201324517 A1 | 6/2013 |
| WO | WO-2010002941 A1 | 1/2010 |
| WO | WO-2011070599 A1 | 6/2011 |
| WO | WO-2013032928 A1 | 3/2013 |

OTHER PUBLICATIONS

"International Application Serial No. PCT/US2012/052333, International Preliminary Report on Patentability mailed Mar. 13, 2014", 8 pgs.

"International Application Serial No. PCT/US2012/052333, International Search Report mailed Jan. 30, 2013", 3 pgs.

"International Application Serial No. PCT/US2012/052333, Written Opinion mailed Jan. 30, 2013", 6 pgs.

"U.S. Appl. No. 14/707,684, Notice of Allowance mailed Apr. 11, 2016", 9 pgs.

"U.S. Appl. No. 14/803,918, Non Final Office Action mailed Dec. 9, 2015", 10 pgs.

"U.S. Appl. No. 14/803,918, Response filed Feb. 25, 2016 to Non Final Office Action mailed Dec. 9, 2015", 8 pgs.

"Chinese Application Serial No. 201280048762.8, Office Action mailed Dec. 14, 2015", (English Translation), 27 pgs.

"European Application Serial No. 12828784.4, Preliminary Amendment filed Oct. 10, 2014", 9 pgs.

"European Application Serial No. 12828784.4, Response filed Nov. 4, 2015 to Extended European Search Report mailed Apr. 29, 2015", 14 pgs.

"Japanese Application Serial No. 2014-527335, Notice of Rejection mailed Oct. 20, 2015", w/ no translation, 7 pgs.

"Japanese Application Serial No. 2014-527335, Response filed Apr. 22, 2016 to Notice of Rejection mailed Oct. 20, 2015", W/ English Claims, 11 pgs.

U.S. Appl. No. 14/707,684, filed May 8, 2015, Threshold Voltage Compensation in a Memory.

U.S. Appl. No. 14/803,918, filed Jul. 20, 2015, Memory Apparatus, Systems, and Methods.

\* cited by examiner

200

| | INFORMATION "IN" VALUE (DECIMAL) | INFORMATION "IN" VALUE (BINARY) | $V_{RAMP}$ VOLTAGE | $V_{RAMP}$ EXAMPLE VALUE (Volt) | VT VALUE RANGE | VT EXAMPLE VALUE (Volt) | ADDRESS | CODE VALUE (BINARY) |
|---|---|---|---|---|---|---|---|---|
| 400 | | | | | $Vt_{0A}$ : $Vt_{0B}$ | -1.0 : -0.5 | : $ADDR_0$ | 111 |
| | 0 | 00000000 | V0 | 0 | | | | |
| | 1 | 00000001 | V1 | 0.1 | | 0.1 | $ADDR_1$ | |
| | 2 | 00000010 | V2 | 0.2 | | 0.2 | $ADDR_2$ | |
| | 3 | 00000011 | V3 | 0.3 | | 0.3 | $ADDR_3$ | |
| | 4 | 00000100 | V4 | 0.4 | | 0.4 | $ADDR_4$ | |
| 401 | 5 : 10 | 00000101 : 00000101 | V5 : V10 | 0.5 : 1.0 | $Vt_{1A}$ : $Vt_{1B}$ | 0.5 : 1.0 | $ADDR_5$ : $ADDR_{10}$ | 011 |
| 402 | 15 : 20 | 00001111 : 00010100 | V15 : V20 | 1.5 : 2.0 | $Vt_{2A}$ : $Vt_{2B}$ | 1.5 : 2.0 | $ADDR_{15}$ : $ADDR_{20}$ | 001 |
| 403 | 25 : 30 | 00011001 : 00011110 | V25 : V30 | 2.5 : 3.0 | $Vt_{3A}$ : $Vt_{3B}$ | 2.5 : 3.0 | $ADDR_{25}$ : $ADDR_{30}$ | 101 |
| 404 | 35 : 40 | 00100011 : 00101000 | V35 : V40 | 3.5 : 4.0 | $Vt_{4A}$ : $Vt_{4B}$ | 3.5 : 4.0 | $ADDR_{35}$ : $ADDR_{40}$ | 100 |
| 405 | 45 : 50 | 00101101 : 00110010 | V45 : V50 | 4.5 : 5.0 | $Vt_{5A}$ : $Vt_{5B}$ | 4.5 : 5.0 | $ADDR_{45}$ : $ADDR_{50}$ | 000 |
| 406 | 55 : 60 | 00110111 : 00111100 | V55 : V60 | 5.5 : 6.0 | $Vt_{6A}$ : $Vt_{6B}$ | 5.5 : 6.0 | $ADDR_{55}$ : $ADDR_{60}$ | 101 |
| 407 | 65 : 70 | 01000001 : 01000110 | V65 : V70 | 6.5 : 7.0 | $Vt_{7A}$ : $Vt_{7B}$ | 6.5 : 7.0 | $ADDR_{65}$ : $ADDR_{70}$ | 110 |
| | : 75 | : 01001011 | : V75 | : 7.5 | | : 7.5 | : $ADDR_{75}$ | |

FIG. 4B

| | INFORMATION "IN" VALUE (DECIMAL) | INFORMATION "IN" VALUE (BINARY) | $V_{RAMP}$ VOLTAGE | $V_{RAMP}$ EXAMPLE VALUE (Volt) | VT VALUE RANGE | CHANGED VT VALUE RANGE | VT EXAMPLE VALUE (Volt) | ADDRESS | CODE VALUE (BINARY) |
|---|---|---|---|---|---|---|---|---|---|
| 400' | | | | | $Vt_{0A}$ | $Vt_{0A'}$ | −1.0 | | 111 |
| | 0 | 00000000 | V0 | 0 | $Vt_{0B}$ | $Vt_{0'}$ | −0.5 | $ADDR_0$ | |
| | 400 1 | 00000001 | V1 | 0.1 | | | 0.1 | $ADDR_1$ | |
| | 2 | 00000010 | V2 | 0.2 | | | 0.2 | $ADDR_2$ | |
| | 3 | 00000011 | V3 | 0.3 | | | 0.3 | $ADDR_3$ | |
| | 401 4 | 00000100 | V4 | 0.4 | | $Vt_{1A'}$ | 0.4 | $ADDR_4$ | |
| 401' [4…9] | 5 | 00000101 | V5 | 0.5 | $Vt_{1A}$ | | 0.5 | $ADDR_5$ | |
| | | | | | | $Vt_{1B'}$ | | | 011 |
| | 10 | 00000101 | V10 | 1.0 | $Vt_{1B}$ | | 1.0 | $ADDR_{10}$ | |
| | 402 | | | | | | | | |
| 402' [17…22] | 15 | 00001111 | V15 | 1.5 | $Vt_{2A}$ | $Vt_{2A'}$ | 1.5 | $ADDR_{15}$ | 001 |
| | 20 | 00010100 | V20 | 2.0 | $Vt_{2B}$ | | 2.0 | $ADDR_{20}$ | |
| | 403 | | | | | $Vt_{2B'}$ | | | |
| 403' [29…34] | 25 | 00011001 | V25 | 2.5 | $Vt_{3A}$ | $Vt_{3A'}$ | 2.5 | $ADDR_{25}$ | 101 |
| | 30 | 00011110 | V30 | 3.0 | $Vt_{3B}$ | | 3.0 | $ADDR_{30}$ | |
| | 404 | | | | | $Vt_{3B'}$ | | | |
| 404' [35…40] | 35 | 00100011 | V35 | 3.5 | $Vt_{4A}$ | $Vt_{4A'}$ | 3.5 | $ADDR_{35}$ | 100 |
| | 40 | 00101000 | V40 | 4.0 | $Vt_{4B}$ | $Vt_{4B'}$ | 4.0 | $ADDR_{40}$ | |
| | 405 | | | | | $Vt_{5A'}$ | | | |
| 405' [42…47] | 45 | 00101101 | V45 | 4.5 | $Vt_{5A}$ | | 4.5 | $ADDR_{45}$ | 000 |
| | | | | | | $Vt_{5B'}$ | | | |
| | 50 | 00110010 | V50 | 5.0 | $Vt_{5B}$ | | 5.0 | $ADDR_{50}$ | |
| | 406 | | | | | $Vt_{6A'}$ | | | |
| 406' [53…59] | 55 | 00110111 | V55 | 5.5 | $Vt_{6A}$ | | 5.5 | $ADDR_{55}$ | 101 |
| | | | | | | $Vt_{6B'}$ | | | |
| | 60 | 00111100 | V60 | 6.0 | $Vt_{6B}$ | | 6.0 | $ADDR_{60}$ | |
| | 407 | | | | | | | | |
| | 65 | 01000001 | V65 | 6.5 | $Vt_{7A}$ | | 6.5 | $ADDR_{65}$ | |
| 407' [69…74] | | | | | | $Vt_{7A'}$ | | | 110 |
| | 70 | 01000110 | V70 | 7.0 | $Vt_{7B}$ | | 7.0 | $ADDR_{70}$ | |
| | | | | | | $Vt_{7B'}$ | | | |
| | 75 | 01001011 | V75 | 7.5 | | | 7.5 | $ADDR_{75}$ | |

FIG. 5B

| INFORMATION "IN" VALUE (DECIMAIL) | INFORMATION "IN" VALUE (BINARY) | $V_{RAMP}$ VOLTAGE | $V_{RAMP}$ EXAMPLE VALUE (Volt) | VT VALUE RANGE | CHANGED VT VALUE RANGE | "IN" CHANGED VALUE | COMPENSATION VALUE |
|---|---|---|---|---|---|---|---|
| ⋮ | ⋮ | ⋮ | ⋮ | ⋮ | | | |
| 24 | 00000000 | V24 | 2.4 | | | | |
| 25 | 00000000 | V25 | 2.5 | $Vt_{3A}$ | | | |
| 26 | 00000001 | V26 | 2.6 | | | 633 | 643 |
| 27 | 00000010 | V27 | 2.7 | | | | |
| 28 | 00000011 | V28 | 2.8 | ⋮ | | | |
| 29 | 00000100 | V29 | 2.9 | | $Vt_{3A'}$ | | |
| 30 | 00000000 | V30 | 3.0 | $Vt_{3B}$ | | +4 | −4 |
| 31 | 00000001 | V31 | 3.1 | | ⋮ | | |
| 32 | 00000010 | V32 | 3.2 | | | | |
| 33 | 00000011 | V33 | 3.3 | | | | |
| 34 | 00000100 | V34 | 3.4 | | $Vt_{3B'}$ | | |
| 35 | 00000000 | V35 | 3.5 | $Vt_{4A}$ | $Vt_{4A'}$ | | |
| 36 | 00000001 | V36 | 3.6 | | | | |
| 37 | 00000010 | V37 | 3.7 | ⋮ | ⋮ | 0 | 0 |
| 38 | 00000011 | V38 | 3.8 | | | | |
| 39 | 00000100 | V39 | 3.9 | | | | |
| 40 | 00000000 | V40 | 4.0 | $Vt_{4B}$ | $Vt_{4B'}$ | | |
| 41 | 00000001 | V41 | 4.1 | | | | |
| 42 | 00000010 | V42 | 4.2 | | $Vt_{5A'}$ | | |
| 43 | 00000011 | V43 | 4.3 | | | | |
| 44 | 00000100 | V44 | 4.4 | | ⋮ | | |
| 45 | 00000011 | V45 | 4.5 | $Vt_{5A}$ | | −3 | +3 |
| 46 | 00000100 | V46 | 4.6 | | | | |
| 47 | 00000000 | V47 | 4.7 | ⋮ | $Vt_{5B'}$ | | |
| 48 | 00000001 | V48 | 4.8 | | | | |
| 49 | 00000010 | V49 | 4.9 | | | 635 | 645 |
| 50 | 00000011 | V50 | 5.0 | $Vt_{5B}$ | | | |
| 51 | 00000100 | V51 | 5.1 | | | | |
| ⋮ | ⋮ | ⋮ | ⋮ | ⋮ | | | |

FIG. 6

LEVEL COMPENSATION IN MULTILEVEL MEMORY

RELATED APPLICATIONS

This application is divisional of U.S. application Ser. No. 13/563,283, filed Jul. 31, 2012, which claims the priority benefit of U.S. application Ser. No. 13/219,439 filed Aug. 26, 2011, and the benefit of priority of U.S. Provisional Application Ser. No. 61/620,628, filed Apr. 5, 2012, and the benefit of priority of U.S. Provisional Application Ser. No. 61/620,636, filed Apr. 5, 2012, the contents of which are incorporated herein by reference in their entirety.

BACKGROUND

Memory devices are often used to store information in many products such as computers, digital televisions, digital cameras, cellular phones, and other electronic products. Such memory devices usually have numerous memory cells to store information. In some of these memory devices, the values of information stored in the memory cells can be based on the threshold voltage values of the memory cells. Factors such as changes in operating temperatures and voltages of the memory device may cause the threshold voltage values of the memory cells to change. This may cause the values of the information stored in the memory cells to deviate from their original values. Therefore, the memory device may give incorrect values for the information when the information is retrieved.

BRIEF DESCRIPTION OF THE DRAWINGS

FIG. 4B is a chart showing relationships among example values of the digital information, threshold voltages, and analog ramp signal of FIG. 4A and additional information including addresses and associated code values, according to an embodiment of the invention.

FIG. 5B is a chart showing relationships among digital information and threshold voltage value ranges before and after the changes shown in FIG. 5A, according to an embodiment of the invention.

FIG. 6 is a chart showing more detail of a portion of the chart in FIG. 5B and further showing additional information including compensation values, according to an embodiment of the invention.

DETAILED DESCRIPTION

Figure 1:
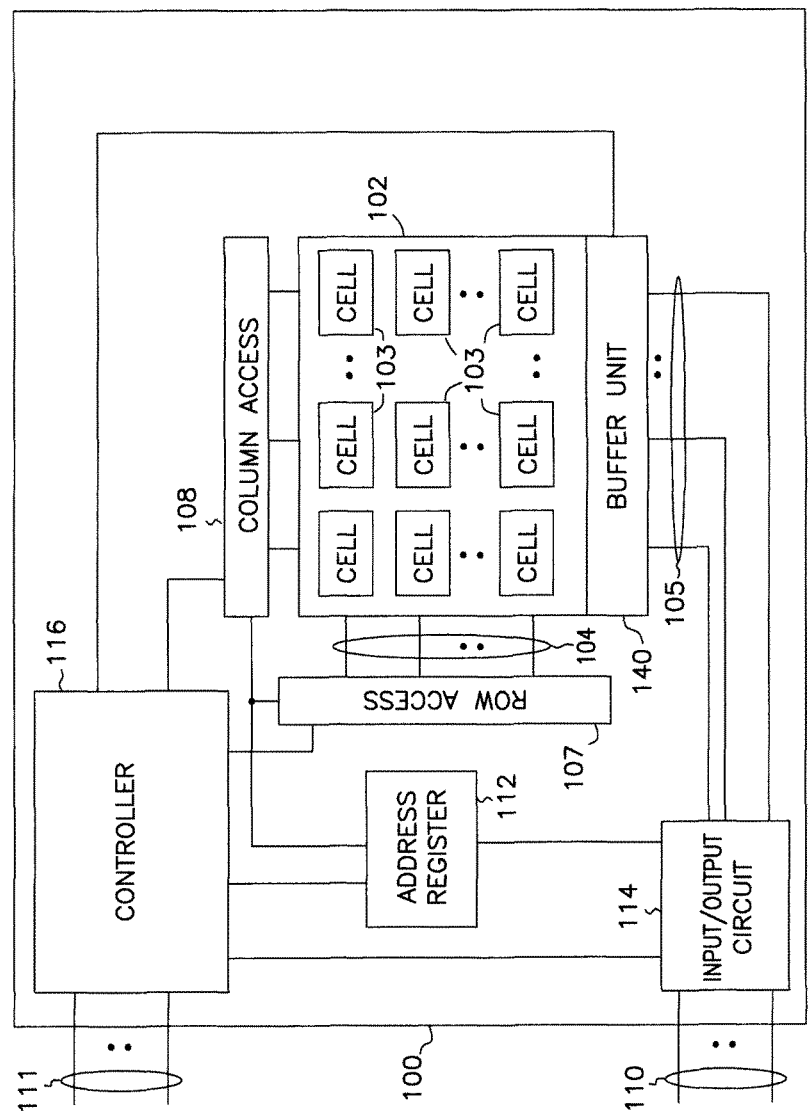
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include a memory array 102 with memory cells 103 that may be arranged in rows and columns along with access lines 104 and data lines 105. Memory device 100 can use access lines 104 to access memory cells 103 and data lines 105 to exchange information with memory cells 103. Row access 107 and column access 108 circuitry can respond to an address register 112 to access memory cells 103 based on row address and column address signals on lines 110, 111, or both. An input/output (I/O) circuit 114 can operate to exchange information between memory cells 103 and lines 110 through a buffer (e.g., page buffer) unit 140. Lines 110 and 111 can include nodes within memory device 100 or pins (or solder balls) on a package where memory device 100 can reside. Buffer unit 140 can include sense amplifiers and latch circuits (not shown in FIG. 1) that can operate during an operation (e.g., a read or write operation) of memory device 100 to determine the values of information to be stored in or retrieved from memory cells 103.

A controller 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both. The device (e.g., a processor or a memory controller) that sends different commands to memory device 100 can be formed on a same semiconductor die as memory device 100, or such a device (e.g., a processor or a memory controller) could be formed on a semiconductor die different from a semiconductor die that forms memory device 100.

Memory device 100 can respond to commands to perform memory operations on memory cells 103, such as performing a write (e.g., programming) operation to store (e.g., program) information in memory cells 103 or a read operation to retrieve information from memory cells 103. Memory device 100 can also perform an erase operation to clear information from some or all of memory cells 103.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" for a single bit. The single bit per cell is sometimes called a single level cell. In another example, each of memory cells 103 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located on multiple levels on the same device, such that some of memory cells 103 can be stacked over some other memory cells 103 in multiple device levels over a substrate (e.g., a semiconductor substrate) of memory device 100.

One of ordinary skill in the art may recognize that memory device 100 may include other elements, several of which are not shown in FIG. 1, so as to not obscure the example embodiments described herein.

Memory device 100 can include a memory device and operations similar to or identical to memory devices described below with reference to FIG. 2 through FIG. 9.

Figure 2:
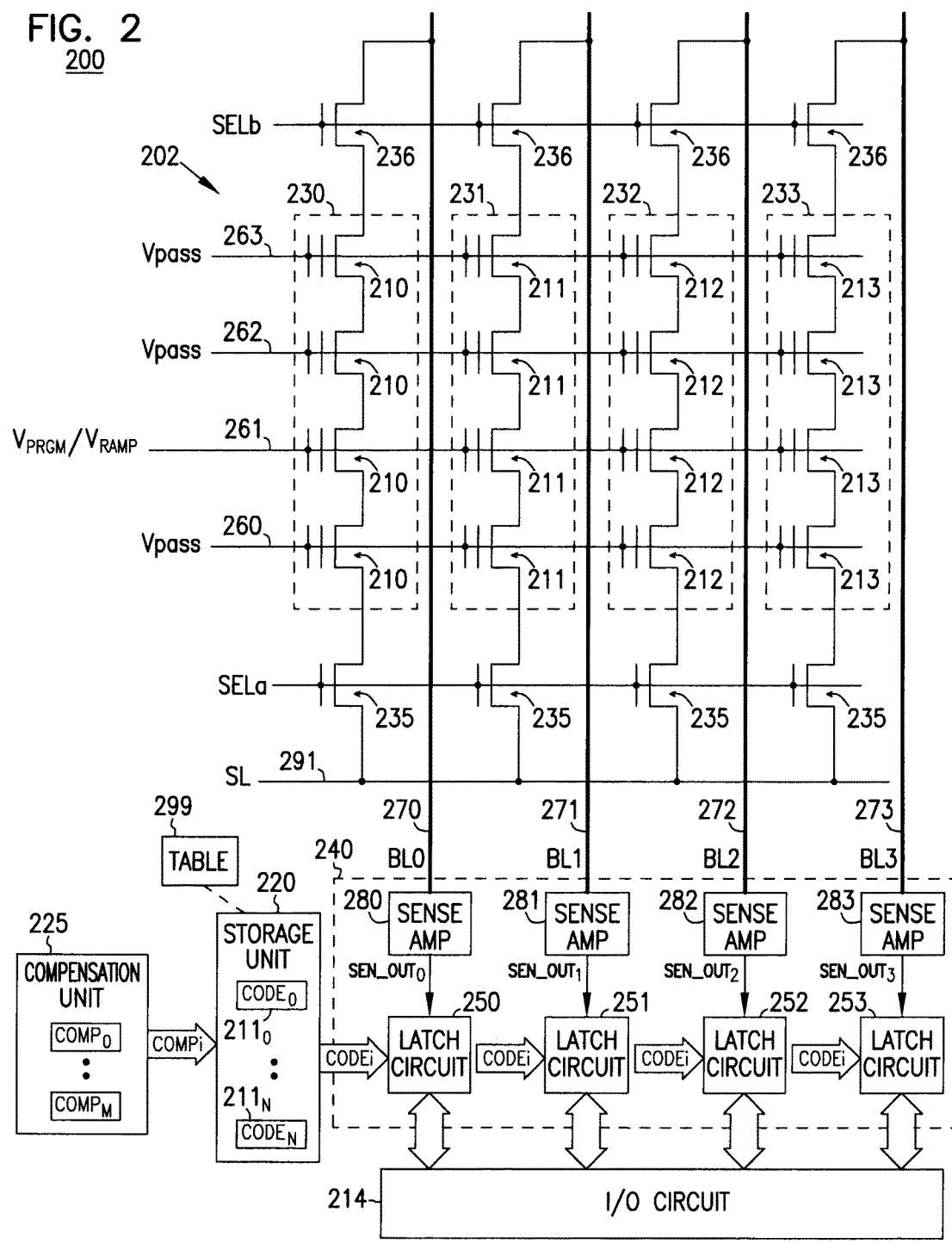
FIG. 2 shows a partial schematic diagram of a memory device, according to an embodiment of the invention.

FIG. 2 shows a partial schematic diagram of a memory device 200, according to an embodiment of the invention. Memory device 200 can be associated with memory device 100 of FIG. 1. For example, memory array 202 of FIG. 2 can form a portion of memory array 102 of memory device 100. In FIG. 2, memory device 200 can include memory cells 210, 211, 212, and 213 that can be coupled in memory cell strings, such as memory cell strings 230, 231, 232, and 233. FIG. 2 shows an example of four memory cell strings and four memory cells in each memory cell string. The number of memory cell strings and memory cells in each memory cell string can vary.

Memory device 200 can include access lines 260, 261, 262, and 263, which can form part of control gates for memory cells 210, 211, 212, and 213. Memory device 200 can use access lines 260, 261, 262, and 263 to access memory cells 210, 211, 212, and 213 in order to store information in memory cells 210, 211, 212, and 213 during a write operation and to retrieve information from memory cells 210, 211, 212, and 213 during a read operation.

Memory device 200 can include transistors 235 and 236 (responsive to signals SELa and SELb, respectively) to couple memory cells 210, 211, 212, and 213 to respective data lines 270, 271, 272, and 273 and to line 291. Line 291 can carry a signal SL (e.g., source signal) and can form part of a source (e.g., source line) of memory device 200.

Memory device 200 can use data lines 270, 271, 272, and 273 to determine the values of information to be stored in (e.g., during a write operation) or retrieved from (e.g., during a read operation) memory cells 210, 211, 212, and 213.

Memory device 200 can apply a signal (e.g., programming signal) $V_{PRGM}$ to access line 261 (e.g., selected access line) and a signal Vpass to each of access lines (e.g., unselected access lines) 260, 262, and 263 during a write operation to store information in one or more selected memory cells 210, 211, 212, and 213 associated with access line 261. Signal Vpass can be provided with a voltage (e.g., 10 volts (V)) to allow memory cells 210 associated with access lines 260, 262, and 263 to operate as pass elements. Signal $V_{PRGM}$ can include a number of pulses with different pulse magnitudes (e.g., from 18V to 20V). During a write operation, memory device 200 can apply signal (e.g., an analog ramp signal) $V_{RAMP}$ between the pulses of signal $V_{PRGM}$ to access line 261. Signal $V_{RAMP}$ can allow memory device 200 to check (e.g., verify) whether the threshold voltage values of the selected memory cells have reached their respective target threshold voltage values. In a read operation, memory device 200 can use the same signal $V_{RAMP}$ to determine the values of information retrieved from memory cells 210, 211, 212, and 213.

Memory device 200 can includes an I/O circuit 214 to exchange information between memory cells 103 and other devices external to memory device 200.

Memory device 200 can include a buffer unit 240 that can include sense amplifiers (SENSE AMP) 280, 281, 282, and 283, and latch circuits 250, 251, 252, and 253. Sense amplifiers 280, 281, 282, and 283 can individually perform a sense operation to respectively sense values of signals BL0, BL1, BL2, and BL3 on corresponding lines 270, 271, 272, and 273. Sense amplifiers 280, 281, 282, and 283 can provide corresponding signals $SEN\_OUT_1$, $SEN\_OUT_2$, $SEN\_OUT_2$, and $SEN\_OUT_3$ to indicate a sense result based on the sense operation. The sense operation can be performed during a write operation and a read operation. During a write operation, the sense result can allow memory device 200 to check (e.g., verify) whether the threshold voltage values representing the values of information in memory cells 210, 211, 212, and 213 have reached their target threshold voltage values. During a read operation, the sense result can allow memory device 200 to determine the values of information retrieved from memory cells 210, 211, 212, and 213.

Latch circuits 250, 251, 252, and 253 can store (e.g., latch) information (e.g., bits of data). In a write operation, the values of information in latch circuits 250, 251, 252, and 253 can represent the values of information to be stored in memory cells 210, 211, 212, and 213. In a read operation, the values of information in latch circuits 250, 251, 252, and 253 can represent the values of information retrieved from memory cells 210, 211, 212, and 213.

Memory device 200 can include a storage unit 220 to store codes, such as codes $CODE_0$ to $CODE_N$, at storage locations $221_0$ to $221_N$. Each of storage locations $221_0$ to $221_N$ can be associated with an address having a unique address value. Codes $CODE_0$ to $CODE_N$ can be selected based on their addresses. Thus, storage locations $221_0$ to $221_N$ can be addressable storage locations.

Codes $CODE_0$ to $CODE_N$ have corresponding code values that can represent values of information to be stored in (e.g., in a write operation) or retrieved from (e.g., in a read operation) memory cells 210, 211, 212, and 213. Each of codes $CODE_0$ to $CODE_N$ can include a combination of bits to provide a code value (e.g., binary value "101"). The code values of codes $CODE_0$ to $CODE_N$ can be used to represent values for multiple bits of information. For example, if each of memory cells 210, 211, 212, and 213 is configured as a 3-bit per cell (multilevel cell), then codes $CODE_0$ to $CODE_N$ can include code values to represent values for all combinations of three bits (e.g., "000," "001," "010," "011," "100," "101," "110," and "111") that can be stored in memory cells 210, 211, 212, and 213.

During an operation (e.g., write or read operation) of memory device 200, storage unit 220 can selectively provide codes $CODE_0$ to $CODE_N$ to latch circuits 250, 251, 252, and 253 as code CODEi. The value of code CODEi can be based on the value of information to be stored in (e.g., in a write operation) or retrieved from (e.g., in a read operation) a selected memory cell among memory cells 210, 211, 212, and 213. Thus, the value of code CODEi provided to latch circuits 250 to 253 can be the same or different from each other, depending on the value of information to be stored in or retrieved from the selected memory cell associated with latch circuits 250 to 253.

Memory device 200 can include a table (e.g., translation table) 299. Table 299 can be implemented by software, firmware, or hardware, or by any combination of software, firmware, and hardware. Table 299 can include information such as codes $CODE_0$ to $CODE_N$ and addresses associated with these codes. Storage unit 220 can implement at least part of table 299. For example, storage unit 220 can include physical memory (e.g., a static random access memory (SRAM) or other non-volatile memory) that can be used to store codes (e.g., codes $CODE_0$ to $CODE_N$) included in table 299.

The information in table 299 can allow memory device 200 to form relationships among a number of values, including relationships between values of signal $V_{RAMP}$ and corresponding values of codes $CODE_0$ to $CODE_N$. Such relationships in table 299 are described in more detail with reference to the charts shown in FIG. 3 through FIG. 6. In FIG. 2, by referring to the information in table 299, memory device 200 can select an appropriate code (e.g., CODEi) among codes $CODE_0$ to $CODE_N$ based at least in part on the value of signal $V_{RAMP}$. The selected code (e.g., CODEi) represents the value of information to be stored in or retrieved from memory cells 210, 211, 212, and 213.

Memory device 200 can include a compensation unit 225 to compensate for changes in threshold voltage values of memory cells 210, 211, 212, and 213. The threshold voltage values of memory cells 210, 211, 212, and 213 can be used to represent the value of information stored in memory cells 210, 211, 212, and 213. In some instances, factors such as changes in operating temperature or voltage, or both, or other factors, may cause the threshold voltage values of memory cells 210, 211, 212, and 213 to change. Compensating for the change in threshold voltage values can allow memory device 200 to provide the correct value (e.g., original value) of information stored in memory cells 210, 211, 212, and 213.

As shown in FIG. 2, compensation unit 225 can store compensation information, such as compensation information $COMP_0$ to $COMP_M$. Each of compensation information $COMP_0$ to $COMP_M$ can include a compensation value. The compensation value can be a number less than zero (negative number), equal to zero, or greater than zero (positive number). During a read operation of memory device 200, compensation unit 225 can provide compensation information COMPi, which is one of compensation information $COMP_0$ to $COMP_M$. Storage unit 220 can select code CODEi based on a compensation value of compensation information COMPi and the address value associated with a storage location in storage unit 220.

Without compensating for the value change, the code (e.g., CODEi) selected by storage unit 220 (to represent the value of information stored in memory cells 210, 211, 212, and 213) may be an incorrect code. Thus, an incorrect value of information may be provided to latch circuits 250 to 253 and subsequently to I/O circuit 214. With compensation, in more detail below with reference to FIG. 3 through FIG. 9, the correct value of information retrieved from memory cells 210, 211, 212, and 213 can be determined and provided to latch circuit 250 and then to I/O circuit 214.

In FIG. 2, storage unit 220 (or part of it), compensation unit 225 (or part of it), and/or table 229 (or part of it) can be included in a controller of memory device 200 that can be similar to or identical to controller 116 of memory device 100 of FIG. 1.

Figure 3:
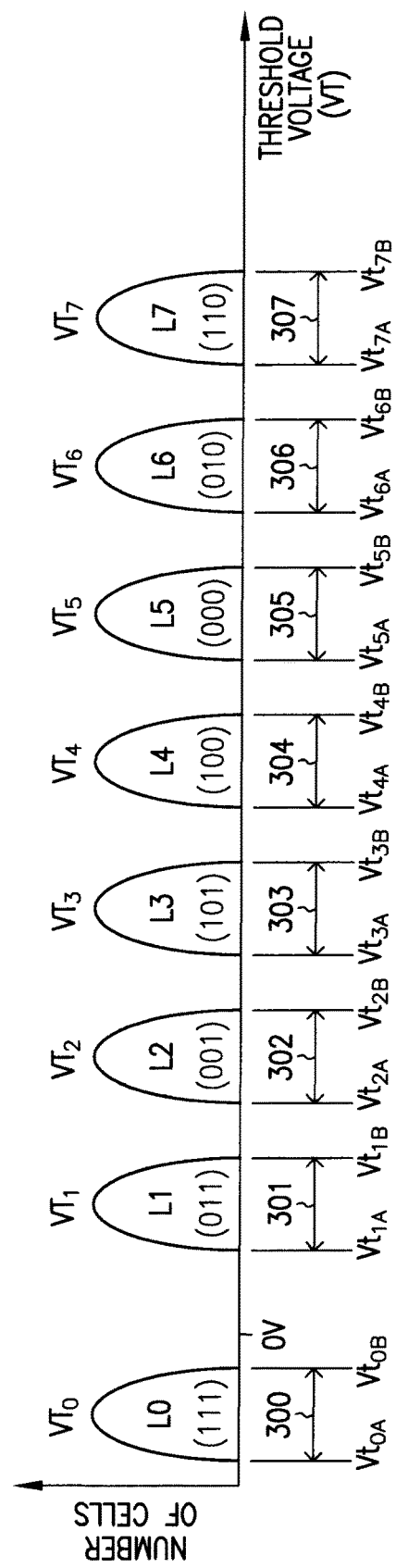
FIG. 3 shows an example of threshold voltage value ranges of the memory device of FIG. 2, according to an embodiment of the invention.

FIG. 3 shows an example of threshold voltage value ranges 300 through 307 of corresponding threshold voltages $VT_0$ through $VT_7$ of memory device 200 of FIG. 2, according to an embodiment of the invention. As described above, memory device 200 can be a multi-level cell memory device. For example, memory device 200 can be a 3-bit per cell memory device. FIG. 3 shows eight levels (sometimes called states), level 0 (L0) through level 7 (L7) that can be used to represent the value of eight different combinations of three bits. Each level has a threshold voltage value range for a corresponding threshold voltage for a large number of memory cells. For example, levels L0 through L7 have respective threshold voltage value ranges for threshold voltages $VT_0$ through $VT_7$.

Each of threshold voltage value ranges 300 to 307 can be used to represent a value for multiple bits. For example, FIG. 3 shows eight threshold voltage value ranges that can be used to represents all eight possible binary values for three bits, including values 111, 011, 001, 101, 100, 000, 010, and 110 corresponding to ranges 300 to 307, respectively. FIG. 3 shows an example order values of three bits. Other orders can be used.

The value of information to be stored in a memory cell during a write operation can correspond to the threshold voltage value within one of threshold voltage value ranges 300 to 307. During a write operation, each of threshold voltages $VT_0$ through $VT_7$ can be a target threshold voltage for a particular memory cell. Thus, a target threshold voltage value can be within any of threshold voltage value ranges 300 through 307. A memory cell that is selected to store information during a write operation is deemed to have reached its target threshold voltage if the threshold voltage value of that memory cell is within the threshold voltage value range (one of ranges 300 to 307) for that level during the write operation. For example, if a memory cell is selected to store information having a value corresponding to level L3 (e.g., value of "101"), that selected memory cell is deemed to have reached its target threshold voltage if the threshold voltage value of that selected memory cell during the write operation is within threshold voltage value range 303 (associated with level L3). A sense result from a sensing operation (e.g., performed by sense amplifiers 280 to 283 of FIG. 2) can be used to determine whether the selected memory cell has reached its target threshold voltage.

As shown in FIG. 3, threshold voltage $VT_1$ can have threshold voltage value range 301, ranging from a lower limit value corresponding to threshold voltage value $Vt_{1A}$ (e.g., 0.5V) to an upper limit value corresponding to threshold voltage value $Vt_{1B}$ (e.g., 1.0V). Threshold voltage $VT_2$ can have threshold voltage value range 302, ranging from a lower limit value corresponding to threshold voltage value $Vt_{2A}$ (e.g., 1.5V) to an upper limit value corresponding to threshold voltage value $Vt_{2B}$ (e.g., 2.0V). Each of the other threshold voltages $VT_0$ and $VT_3$ through $VT_7$ can also have a lower limit value and an upper limit value in their corresponding threshold voltage value range, such as threshold voltage values $Vt_{0A}$ and $Vt_{0B}$, $Vt_{3A}$ and $Vt_{3B}$, $Vt_{4A}$ and $Vt_{4B}$, $Vt_{5A}$ and $Vt_{5B}$, $Vt_{6A}$ and $Vt_{6B}$, and $Vt_{7A}$ and $Vt_{7B}$.

Figure 4A:
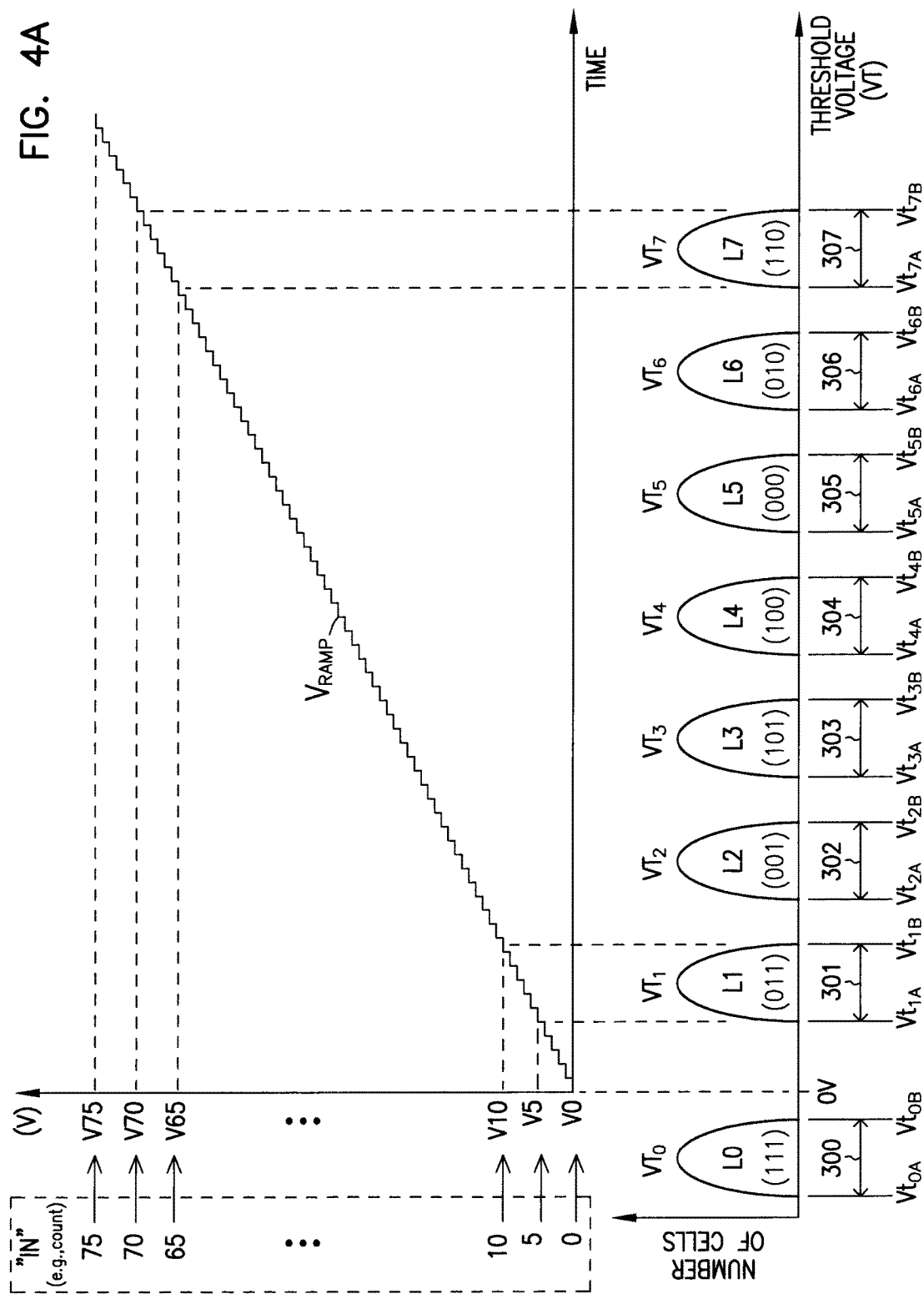
FIG. 4A is a graph showing relationships among values of digital information, threshold voltages, and an analog ramp signal, according to an embodiment of the invention.

FIG. 4A is a graph showing relationships among values of information IN, threshold voltages $VT_0$ through $VT_7$, and signal $V_{RAMP}$, according to an embodiment of the invention. During a write operation, signal $V_{RAMP}$ can be used to check (e.g., verify) whether a threshold voltage of a selected memory reaches its target threshold voltage value. During a read operation, the same signal $V_{RAMP}$ can be used to determine the value of information retrieved from a selected memory cell.

As shown in FIG. 4A, signal $V_{RAMP}$ can be an analog ramp signal with increasing steps, such as a step (e.g., a starting step) associated with a voltage V0 (e.g., zero volts) and a step (e.g., ending step) associated with a voltage V75 (e.g., 7.5 volts). FIG. 4A shows an example where signal $V_{RAMP}$ can start from a step associated with zero volts and end with a step associated with 7.5V. The start and end voltage values of signal $V_{RAMP}$ can vary. For example, signal $V_{RAMP}$ can start from a negative voltage and end at a voltage different from 7.5V.

Signal $V_{RAMP}$ can be generated based on information IN. Information IN can be digital information (e.g., provided by a digital signal). Information IN can include digital values. Each step of signal $V_{RAMP}$ can be generated based on a corresponding value of information IN. For example, a first step (associated with a voltage V0) of signal $V_{RAMP}$ can be generated based on a first value (value 0) of information IN. The fifth and tenth steps of signal $V_{RAMP}$ can be generated based on fifth and tenth values, respectively, of information IN. Based on this pattern, the steps of signal $V_{RAMP}$ can be sequentially generated based on sequential values of information IN. As an example, information IN can include counts from a counter in memory device 200. The counts from information IN can be provided to an input of a digital to analog converter (DAC) memory device 200. Based on the counts from information IN, the DAC can generate an analog ramp signal, such as signal $V_{RAMP}$, at its output.

FIG. 4B is a chart 450 showing relationships among example values of information IN, signal $V_{RAMP}$, and threshold voltage value ranges 300 to 307 of FIG. 4A and additional information including addresses and associated code values, according to an embodiment of the invention.

As shown in FIG. 4B, information IN can include values (shown in both decimal and binary forms) from zero to 75 in a consecutive order. The values of information IN can be organized into sets of values, such as set of values 400 to set of values 407. Each of sets of values 400 to 407 can include a number of values, which can be in a consecutive order. The values from one set to another set, however, can be in a non-consecutive order. In other words, the values from one set to another set are not continuous. For example, set of values 403 can include six values in a consecutive order from 25 to 30. Set of values 404 can include six values in a consecutive order from 35 to 40. Set of values 405 can include six values in a consecutive order from 45 to 50. In this example, values from 31 to 34 and from 41 to 44 can be excluded from sets of values 403, 404, and 405. FIG. 4B shows an equal number (e.g., six) of values in sets of values 400 to 407 as an example. The number of values from one set to another set can be different. For example, one set can have six values and another set can have five or seven values, or other numbers. The number of values in each of sets of values 400 to 407 can be based on the threshold voltage value range (e.g. how wide or how narrow) of a corresponding threshold voltage (FIG. 4A).

As shown in FIG. 4B, each of sets of values 400 to 407 can be associated with a respective threshold voltage value ranges 300 to 307 of FIG. 4A. For example, set of values 403 can be associated with threshold voltage value range 303 that corresponds to threshold voltage values $Vt_{3A}$ to $Vt_{3B}$. Set of values 404 can be associated with threshold voltage value range 304 that corresponds to threshold voltage values $Vt_{4A}$ to $Vt_{4B}$.

Addresses $ADDR_0$ to $ADDR_{75}$ in FIG. 4B can be addresses associated with storage locations $221_0$ to $221_N$ of storage unit 220 of FIG. 2. Thus, each of codes $CODE_0$ to $CODE_N$ (FIG. 2) stored in corresponding storage locations $221_0$ to $221_N$ can be associated with one of addresses $ADDR_0$ to $ADDR_{75}$. Each of addresses $ADDR_0$ to $ADDR_{75}$ can have an address value, which can be a value of a combination of bits. For example, if eight bits are used to represent the address values of addresses $ADDR_0$ to $ADDR_{75}$, then the value of each of addresses $ADDR_0$ to $ADDR_{75}$ can correspond to a value of eight bits. The address values can be in consecutive order corresponding to the index numbers (e.g., index 0 to 75) of addresses $ADDR_0$ to $ADDR_{75}$. For example, addresses $ADDR_0$ can have an address value 00000000, address $ADDR_1$ can have an address value 00000001, and so on, such that address $ADDR_{75}$ can have an address value 01001011. The order of these address values can correspond to (e.g., can be the same as) the order of the values of information IN shown in FIG. 4B. Thus, the relationship between the values of information IN and the address values of addresses $ADDR_0$ to $ADDR_{75}$ can be a linear relationship.

FIG. 4B shows an example of 76 addresses ($ADDR_0$ to $ADDR_{75}$) associated with 76 corresponding storage locations $221_0$ to $221_N$ where N=75. The number of addresses can vary, depending on the number of storage locations of storage unit 220.

Addresses $ADDR_0$ to $ADDR_{75}$ can be organized into address ranges. As shown in FIG. 4B, the address ranges can be associated with sets of values 400 to 407 of information IN. For example, the address range having addresses $ADDR_{25}$ to $ADDR_{30}$ can be associated with set of values 403. In another example, the address range having addresses $ADDR_{35}$ to $ADDR_{40}$ can be associated with set of values 404.

Code values (binary values) 111, 011, 001, 101, 100, 000, 010, and 110 in FIG. 4B are values of codes $CODE_0$ to $CODE_N$ (FIG. 2) stored in corresponding locations storage locations $221_0$ to $221_N$. Each of these code values can be associated with an address range in addresses $ADDR_0$ to $ADDR_{75}$. Thus, the addresses within the same address range can be associated with the same code value. For example, the address range having addresses $ADDR_{25}$ to $ADDR_{30}$ can be associated with the same code value "101". In another example, the address range having addresses $ADDR_{35}$ to $ADDR_{40}$ can be associated with the same code value "100".

FIG. 4B does not show some code values associated with certain addresses to indicate that such code values (not shown) can be different from the code values (e.g., shown as 111, 011, 001, 101, 100, 000, 010, and 110) associated with the address ranges of $ADDR_0$ to $ADDR_{75}$. For example, code values (not shown in FIG. 4B) associated with addresses $ADDR_{31}$ to $ADDR_{34}$ (addresses between addresses $ADDR_{30}$ and $ADDR_{35}$) can be different from code values "101" and "100" associated with addresses $ADDR_{25}$ to $ADDR_{30}$ and addresses $ADDR_{35}$ to $ADDR_{40}$, respectively.

Some or all of information in chart 450 can be part of table 299 (FIG. 2). Memory device 200 can store information in memory cells 210, 211, 212, and 213 during a write operation with values based on chart 450. For example, in a write operation, if information having a value (binary value) of "101" is to be stored in a selected memory cell among memory cells 210, 211, 212, and 213, then (based on chart 450) memory device 200 can perform the write operation to cause the threshold voltage of the selected memory cell to reach a target threshold voltage value within a threshold voltage value range between the values of $Vt_{3A}$ and $Vt_{3B}$ (e.g., between 2.5V to 3.0V). Thus, right after the write operation, the threshold voltage value of the selected memory cell can be between threshold voltage values $Vt_{3A}$ and $Vt_{3B}$ corresponding to value "101," which is the value of information stored in the selected memory cell in this example.

Figure 5A:
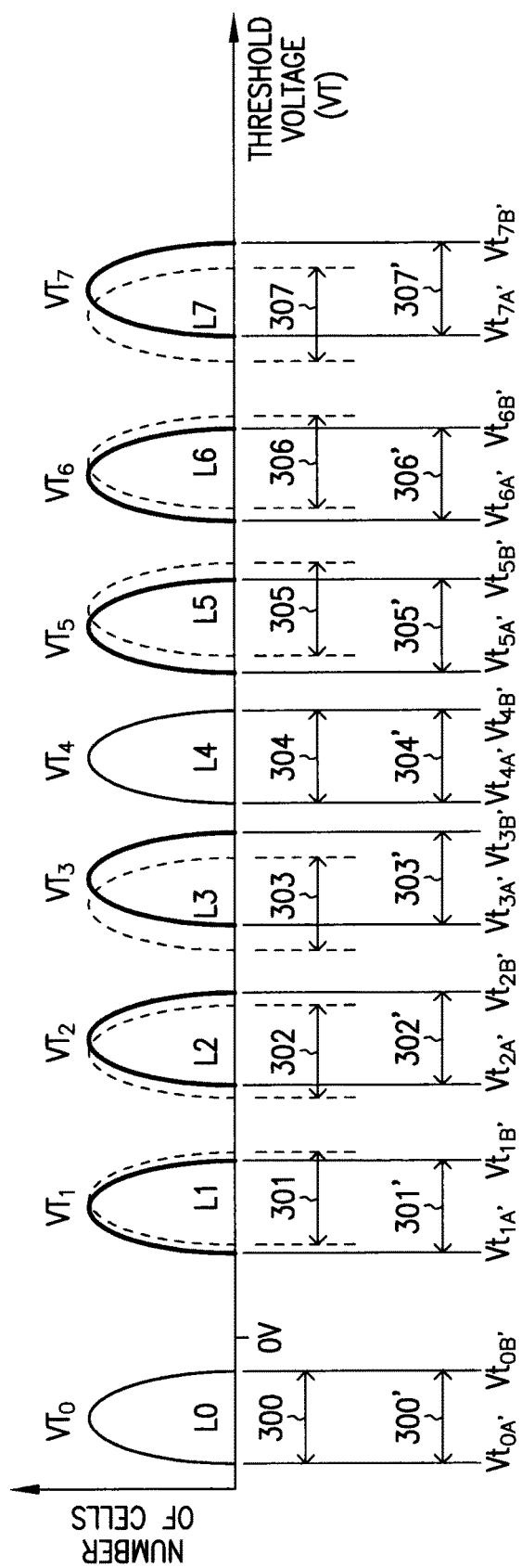
FIG. 5A shows an example of changes in the threshold voltage value ranges of FIG. 3, according to an embodiment of the invention.

FIG. 5A shows an example of changes in the threshold voltage value ranges of FIG. 3, according to an embodiment of the invention. Threshold voltage value ranges 303 to 307 of FIG. 3 are shown as a dashed line in FIG. 5A. Threshold voltage value ranges 300' to 307' (shown as a solid line in FIG. 5A) correspond to changes of their respective threshold voltage value ranges 300 to 307.

Threshold voltage value ranges 300' to 307' can be determined by, for example, storing information in memory cells 210, 211, 212, and 213 during a write operation. The values of the information to be stored can be based on corresponding threshold voltage value ranges 303 to 307. After the information is stored, factors that are expected to cause the threshold voltage values to change, as described above, can be induced to memory device 200 during a read operation retrieving the stored information. Then, based on the threshold voltage values retrieved from memory cells 210, 211, 212, and 213 in the read operation, threshold voltage value ranges 300' to 307' in FIG. 5A can be determined.

Thus, the voltage values in threshold voltage value ranges 303 to 307 (original values) and in their respective threshold voltage value ranges 300' to 307' (retrieved values) are known values. Therefore, the lower and upper limit values of threshold voltage value ranges 300 to 307 and 300' to 307' are known values. Similar to FIG. 3, the lower and upper limit values each of threshold voltage value ranges 300' to 307' in FIG. 5A can include threshold voltage values $Vt_{0A'}$ and $Vt_{0B'}$, $Vt_{1A'}$ and $Vt_{1B'}$, $Vt_{2A'}$ and $Vt_{2B'}$, $Vt_{3A'}$ and $Vt_{3B'}$, $Vt_{4A'}$ and $Vt_{4B'}$, $Vt_{5A'}$ and $Vt_{5B'}$, $Vt_{6A'}$ and $Vt_{6B'}$, and $Vt_{7A'}$ and $Vt_{7B'}$. Based on these known values of threshold voltage value ranges 303 to 307 and 303' to 307', a compensation value (e.g., values of compensation information $COMP_0$ to $COMP_M$ in FIG. 2) for each of threshold voltage value ranges 303 to 307 can be determined.

As shown in FIG. 5A, some of threshold voltage value ranges 300' to 307' (e.g., 301', 302', 303', 305', 306', and 307') can be different from their respective threshold voltage value ranges 303 to 307. Some of threshold voltage value ranges 303' to 307' (e.g., 300' and 304') can be the same as their respective threshold voltage value ranges 303 to 307.

Changes among threshold voltage value ranges can be different in directions (e.g., some can increase in values and some can decrease in values). For example, as shown in FIG. 5A, the lower and upper limit values ($Vt_{3A'}$ and $Vt_{3B'}$) of the threshold voltage value range associated with level L3 can increase relative to their respective limit values ($Vt_{3A}$ and $Vt_{3B}$) before the change. In another example, the lower and upper limit values ($Vt_{5A'}$ and $Vt_{5B'}$) of the threshold voltage value range associated with level L5 can decrease relative to their respective limit values ($Vt_{5A}$ and $Vt_{5B}$) before the change.

The changes among threshold voltage value ranges can be different in values. For example, the lower and upper limit values of the threshold voltage value range associated with level L3 can change (e.g., increase) by a greater amount than that of lower and upper limit values of the threshold voltage value range associated with level L2.

FIG. 5B is a chart 550 showing relationships among information IN and threshold voltage value ranges 303 to 307 and 300' to 307' of FIG. 5A, according to an embodiment of the invention. Chart 550 is the same as chart 450 in FIG. 4B, except for column 551 and set of values 400' to set of values 407' of information IN. Column 551 shows changes in threshold voltage value ranges 303' to 307' relative to the threshold voltage value ranges 303 to 307. Set of values 400' to 407' of information IN can be associated with threshold voltage value ranges 303' to 307'. Some or all of information in chart 550 can be part of table 299 (FIG. 2).

As shown in FIG. 5B, some of sets of values 400' to 407' (e.g. 400' and 404') can be the same of their respective sets of values 400 to 407. Some of sets of values 400' to 407' (e.g. 401', 402', 403', 405, 406' and 407') can be different from sets of values 400 to 407.

Based on chart 550 during a read operation, memory device 200 (FIG. 2) can provide appropriate compensation, so that correct value (original value) of information stored in the memory cells can be determined even if their threshold voltage values change. For example, as shown in chart 550, the threshold voltage value ranges associated with sets of values 400 to 407 of information IN may change to their respective threshold voltage value ranges associated with sets of values 400' to 407' of information IN.

FIG. 6 is a chart 650 showing more detail of a portion of chart 550 of FIG. 5B and further showing additional information including compensation values 643, 644, and 645, according to an embodiment of the invention. Some or all of information in chart 650 can be part of table 299 (FIG. 2).

Compensation values 643, 644, and 645 in chart 650 can be used during a read operation to determine a correct address (FIG. 5B) at which an associated code value (FIG. 5B) can be selected to represent the value of information stored in a memory cell. As shown in FIG. 6, compensation values 643, 644, and 645 can be less than zero, equal to zero, or greater than zero. For example, compensation values 643, 644, and 645 can be −4, 0, and +3, respectively.

Compensation values 643, 644, and 645 can be determined (e.g., calculated) based on their respective offset values 633, 634, and 635. For example, compensation values 643, 644, and 645 can have values −4, 0, and +3, respectively, and offset values 633, 634, and 635 have values of +4, 0, and −3, respectively. Thus, compensation values 643, 644, and 645 can be equal to offset values 633, 634, and 635, respectively, but with opposite signs (+ or −).

Offset values 633, 634, and 635 can be determined from offsets 623, 624, and 625, which can be determined based on corresponding limit values (e.g., lower or upper limit value) of two sets of values of information IN, one from sets of values 400' to 407' and another one from sets of values 400 to 407. For example, offset 623 can be determined based on a difference between a value (e.g., lower limit) in set of values 403' and a value (e.g., lower limit) in set of values 403. As shown in FIG. 6, sets of values 403' and 403 can have lower limits of 29 and 25, respectively. Thus, offset 623 can have an offset value of +4 (29 minus 25). Similarly, offset 625 can have an offset value of −3 (42 minus 45). Offset 624 can have a value of zero because sets of values 404 and 404' can have the same limits (e.g., unchanged), from 35 to 40. Other offset values between sets of values 400' to 407' and corresponding sets of values 400 to 407 can be determined in a similar way. Thus, based on sets of values 400' to 407' of information IN and corresponding sets of values 400 to 407 of information IN, the offset values can include 0, −1, +2, +4, 0, −3, −2, and +4, respectively. Therefore, the compensation values associated with sets of values 400' to 407' can include 0, +1, −2, −4, 0, +3, +2, and −4, respectively.

FIG. 6 also shows values $613_A$, $613_B$, $615_A$, and $615_B$ associated with changes in threshold voltage values $Vt_{3A}$, $Vt_{3B}$, $Vt_{5A}$, and $Vt_{5B}$, respectively. FIG. 6 shows an example where values $613_A$ and $613_B$ can be the same (e.g., corresponding to four values of information IN) and values $615_A$ and $615_E$ can be the same (e.g., corresponding to three values of information IN). Values $613_A$ and $613_B$ can be different from each other. Similarly, values $615_A$ and $615_E$ can be different from each other. FIG. 6 also shows values $614_A$ and $614_B$ associated with threshold voltage values $Vt_{4A}$ and $Vt_{4B}$, respectively. Values $614_A$ and $614_B$ can be zero because the threshold voltage value range corresponding to threshold voltage values $Vt_{4A}$ and $Vt_{4B}$ can remain unchanged, such that threshold voltage values $Vt_{4A}$ and $Vt_{4B}$ can be equal to threshold voltage values $Vt_{4A'}$ and $Vt_{4B'}$, respectively.

Based on the relationships among values in chart 450 (FIG. 4B), chart 550 (FIG. 5B), and chart 650 (FIG. 6), memory device 200 (FIG. 2) can apply compensation values in the digital domain to select correct code values. For example, memory device 200 can use the compensation values of compensation information $COMP_0$ to $COMP_M$ to select correct code values of codes $COMP_0$ to $COMP_M$ at storage locations having address values based on the compensation values. This allows different compensation values to be applied to different changes among the threshold voltage value ranges of memory cells 210, 211, 212, and 213.

Figure 7:
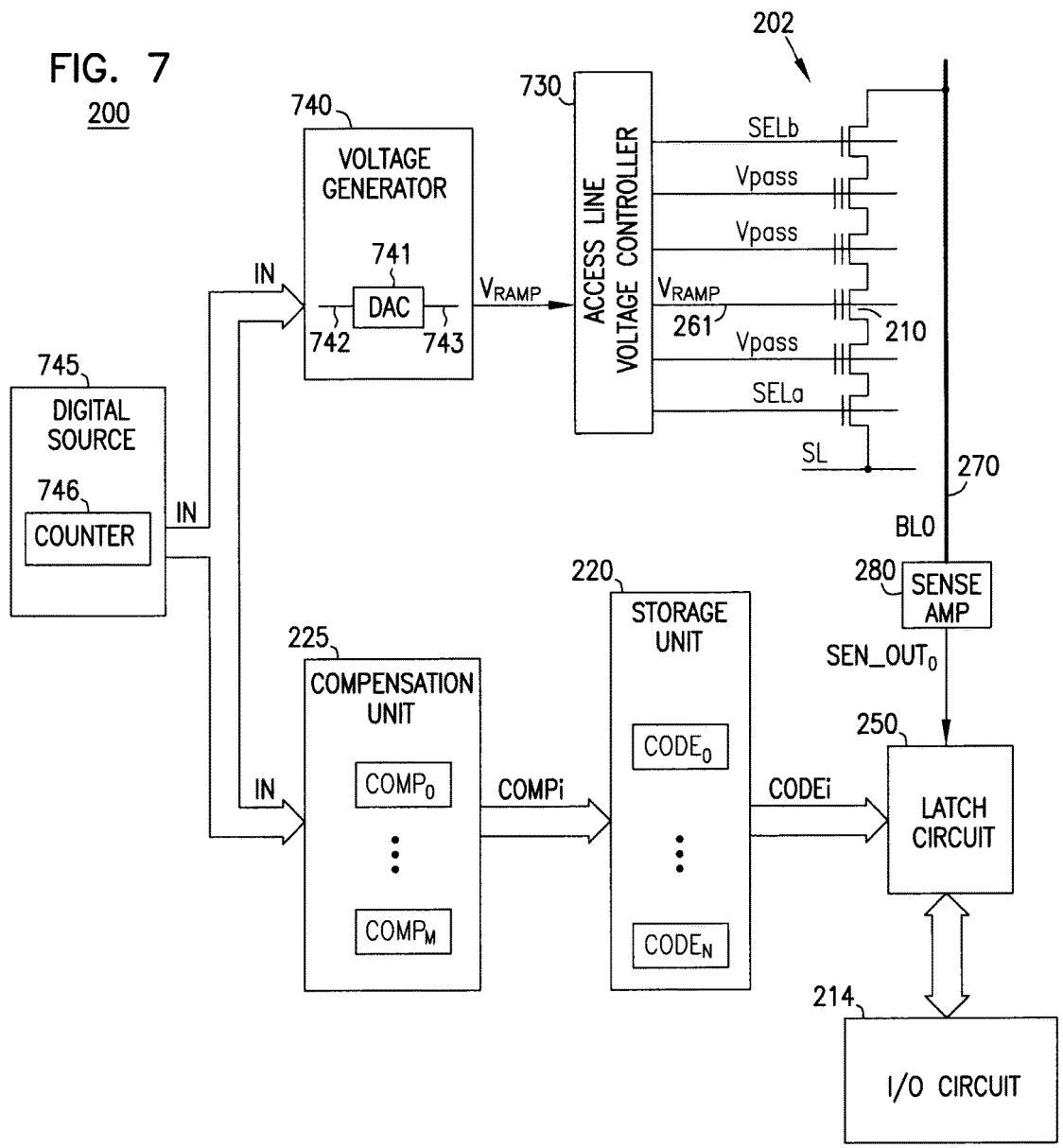
FIG. 7 shows a schematic diagram of another portion of the memory device of FIG. 2, according to an embodiment of the invention.

FIG. 7 shows a schematic diagram of another portion of memory device 200, according to an embodiment of the invention. For simplicity, FIG. 7 shows only one memory cell string, including a memory cell 210, and associated line 270, sense amplifier 280, and latch circuit 250.

Memory device 200 can include an access line voltage controller 730, which can be part of a row access circuitry similar to row access 107 circuitry of FIG. 1. Access line voltage controller 730 can provide signals $V_{RAMP}$, SELb, Vpass, SELa, and SL that can correspond to those of FIG. 2. Line 261 in FIG. 7 is the same as line 261 of FIG. 2.

Memory device 200 can include a digital source 745 that can include a counter 746. Counter 746 can generate a number of counts. Each count can include a value based on a combination of bits. For example, each count can include eight bits having a value similar to or identical to the value (binary value) of information IN shown in chart 450 (FIG. 4B), chart 550 (FIG. 5B), and chart 650 (FIG. 6). As shown in FIG. 7, digital source 745 can generate information IN, which can have values based on values of the counts from counter 746. Information IN can be provided to both compensation unit 225 and a voltage generator 740.

Voltage generator 740 can generate signal $V_{RAMP}$ based on information IN. For example, voltage generator 740 can include a DAC 741 having an input 742 and an output 743. DAC 741 can receive information IN in the form of combinations of bits at its input and generate signal $V_{RAMP}$ at output 743 with values (e.g., analog value) corresponding to the combinations of bits.

Storage unit 220 and compensation unit 225 can operate in fashions described above with reference to FIG. 2 through FIG. 6.

The following description describes an example read operation to retrieve information from memory cell 210 based on chart 550 (FIG. 5B) and chart 650 (FIG. 6).

In a read operation, signal $V_{RAMP}$ can be applied to line 261 as shown in FIG. 7. At each step of signal $V_{RAMP}$, sense amplifier 280 can perform a sense operation to sense signal BL0 to determine whether a conduction of current through memory cell 261 has occurred. For example, if signal $SEN\_OUT_0$ changes from one level (e.g., high) to another level (e.g., low) during the sense operation, then it can be determined that the conduction of current through memory cell 210 has occurred. If signal $SEN\_OUT_0$ remains unchanged at the same level (e.g., remains at a high level) during the sense operation, then it can be determined that no conduction of current through memory cell 210 has occurred.

If the conduction of current has occurred, storage unit 220 can select one of codes $CODE_0$ to $CODE_N$ to be code CODEi and provide it to latch circuit 250. The value from latch circuit 250 (which is the same as the value of CODEi) can be provided to I/O circuit 214 as the value of information retrieved memory cell 210. I/O circuit 214 can provide the value of information to an external device (e.g., a processor) for further processing.

If no conduction of current through memory cell 210 has occurred, memory device 200 can repeat the sense operation in one or more subsequent steps of signal $V_{RAMP}$ until the conduction of current has occurred.

Storage unit 220 can select code CODEi based on a combination (e.g., sum) of the compensation value of compensation information $COMP_I$ and the address value of one of addresses $ADDR_0$ to $ADDR_{75}$. The combination can be expressed as $ADDR_{J+C}$ where "J" represents index of the address (e.g., "J" can be from 0 to 75 as shown in the example of FIG. 5B). Address $ADDR_J$ corresponds to an address (chart 550 in FIG. 5B) associated with a value of information IN that is associated with the voltage value of signal $V_{RAMP}$ that causes a conduction of current through memory cell 210 to occur. In $ADDR_{J+C}$, "C" represents the compensation value of code $COMP_I$ associated with the set of values of information IN that is associated with the voltage of signal $V_{RAMP}$ that causes a conduction of current through memory cell to occur. Thus, based on the compensation value and the address value of address $ADDR_J$, a correct code value for CODEi can be determined to represent the value of information retrieved from memory cell 210.

For example, as shown in chart 550 of FIG. 5B and chart 650 of FIG. 6, if the original value of information stored in memory cell 210 is "101" (binary value), which can correspond to threshold voltage value $Vt_{3B}$, and if during a read operation a current conduction through memory cell 210 occurs when signal $V_{RAMP}$ has a voltage V34 (e.g., 3.4V), then in this example, address $ADDR_J$ $ADDR_{34}$ (based on chart 550 in FIG. 5B) because it is the address associated with voltage V34 of signal $V_{RAMP}$. Compensation value "C" in this example is −4 (based on chart 650 in FIG. 6) because is it associated with set of values 403' (values 29 to 34) of information IN that is associated with voltage V34 of signal $V_{RAMP}$. Thus, in this example, address $ADD_{RJ+C}=ADD_{R34+(-4)}=ADDR_{30}$. Therefore, storage unit 220 can select a code (among codes $CODE_0$ to $CODE_N$) associated with address $ADDR_{30}$ to be code CODEi and provide it to latch circuit 250. In this example, the code having a code value "101" (based on chart 550 in FIG. 5B) is selected because code value "101" is associated with address $ADDR_{30}$. Thus, code value "101," which is the same as the original value "101" stored in memory cell 210, is provided to latch circuit 250 as the value of information stored in memory cell 210.

In another example, as shown in chart 550 of FIG. 5B and chart 650 of FIG. 6, if the original value of information stored in memory cell 210 is "000" (binary value), and if during a read operation a current conduction through memory cell 210 occurs when signal $V_{RAMP}$ has a voltage V42 (e.g., 4.2V), then in this example, address $ADDR_J=ADDR_{42}$ because (based on chart 550 in FIG. 5B) it can be the address associated with voltage V42 of signal $V_{RAMP}$. Compensation value "C" in this example is +3 (based on chart 650 in FIG. 6) because is it associated with set of values 405' (values 42 to 47) of information IN that is associated with voltage V42 of signal $V_{RAMP}$. Thus, in this example, address $ADDR_{J+C}=ADDR_{42+(+3)}=ADDR_{45}$. Therefore, storage unit 220 can select a code associated with address $ADDR_{45}$ to be code CODEi and provide it to latch circuit 250. In this example, the code having a code value "000" (based on chart 550 in FIG. 5B) is selected because code value "000" is associated with address $ADDR_{45}$. Thus, code value "000", which is the same as the original value "000" stored in memory cell 210, is provided to latch circuit 250 as the value of information stored in memory cell 210.

In a further example, as shown in chart 550 of FIG. 5B and chart 650 of FIG. 6, if the original value of information stored in memory cell 210 is "100" (binary value), and if during a read operation a current conduction through memory cell 210 occurs when signal $V_{RAMP}$ has a voltage V35 (e.g., 3.5V), then in this example, address $ADDR_J = ADDR_{35}$ (based on chart 550 in FIG. 5B) because it can be the address associated with voltage V35 of signal $V_{RAMP}$. Compensation value "C" in this example is zero (based on chart 650 in FIG. 6) because is it associated with set of values 404' (values 35 to 40) of information IN that is associated with voltage V35 of signal $V_{RAMP}$. Thus, in this example, address $ADDR_{J+C} = ADDR_{35+(0)} = ADDR_{35}$. Therefore, storage unit 220 can select a code associated with address $ADDR_{35}$ to be code CODEi and provide it to latch circuit 250. In this example, the code having a code value "100" (based on chart 550 in FIG. 5B) is selected because code value "100" is associated with address $ADDR_{35}$. Thus, code value "100", which is the same as the original value "100" stored in memory cell 210, is provided to latch circuit 250 as the value of information stored in memory cell 210.

Thus, as described in the above examples, although a threshold voltage value (e.g., $Vt_{3B}$) corresponding to the value (e.g., "101") of information stored in memory cell 210 during a write operation can change to a different threshold voltage value (e.g., $Vt_{3B'}$), correct value (e.g., "101") of the stored information during a read operation can still be determined based on compensation techniques described herein.

Figure 8:
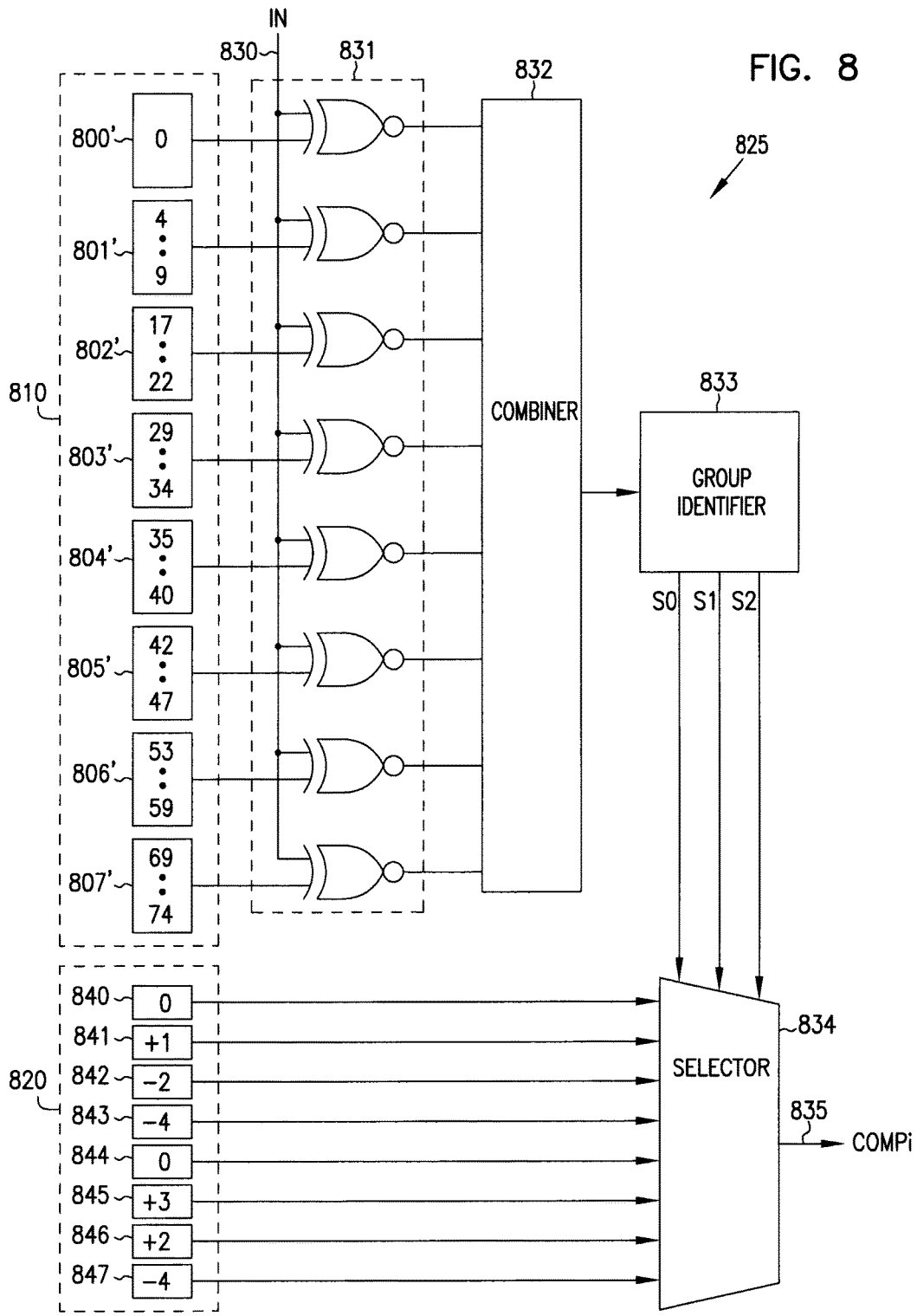
FIG. 8 shows a block diagram of a compensation unit, according to an embodiment of the invention.

FIG. 8 shows a block diagram of a compensation unit 825, according to an embodiment of the invention. Compensation unit 825 can correspond to compensation unit 225 described above with reference to FIG. 2 through FIG. 7. As shown in FIG. 8, compensation unit 825 can include an input 830 to receive information IN, which can be similar to or identical to information IN described above with reference to FIG. 2 through FIG. 7. Compensation unit 825 can include storage components 810 and 820, which can include non-volatile memory.

Storage components 810 can include storage portions 800' to 807', each of which can store a group of values. FIG. 8 shows storage portion 800' storing a single value (e.g., zero) as an example; however, storage portion 800' can store multiple values (e.g., from some negative values to zero).

As shown in FIG. 8, the groups of values stored in storage portions 800' to 807' can be based on the values of digital information, such as based on corresponding sets of values 400' to 407' of information IN in FIG. 5B. For example, storage portion 803' can store a group of values from 29 to 34, which corresponds to set of values 403' in FIG. 5B. Storage portion 804' can store a group of values from 35 to 40, which corresponds to set of values 404' in FIG. 5B. Storage portion 805' can store a group of values from 42 to 47, which corresponds to set of values 405' in FIG. 5B. As shown in FIG. 8, storage portions 801', 802', 806', and 807' can store respective groups of values 4 to 9, 17 to 22, 53 to 59, and 69 to 74. Similar to the order of sets of values 400' to 407' of information IN (FIG. 5B), a group of values stored in each of storage portions 800' to 807' can be in a consecutive order. The number of values (e.g., six) in each group of values can also be the same as the number of values in each of sets of values 400' to 407' of information IN.

FIG. 8 shows compensation unit 825 storing eight groups of values as an example. The number of groups of value can vary. For example, the number of groups of value can be based on the number of threshold voltage value ranges of a memory device, such as memory device 200 of FIG. 2.

Storage component 820 of FIG. 8 can include storage portions 840 to 847, each of which can store a compensation value, such as one of compensation values 0, +1, −2, −4, 0, +3, +2, or −4. These compensation values can be determined from the values information IN, as described above with reference to FIG. 5B and FIG. 6. For example, each of compensation values in FIG. 8 can be determined based on a difference between a value in one set of values (one of 400' to 407' of FIG. 5B) of information IN and a value in another set (e.g., one of 400 to 407 of FIG. 5B) of values of information IN. FIG. 8 shows compensation values of 0, +1, −2, −4, 0, +3, +2, and −4 as an example, but the compensation values can vary, depending on the values of changes in corresponding threshold voltage value ranges, such as changes in threshold voltage value ranges 300 to 307 (FIG. 5A and FIG. 5B).

Each of the compensation values stored in storage portions 840 to 847 can be associated with a different group of values stored in storage portions 800' to 807. For example, compensation values 0, +1, −2, −4, 0, +3, +2, and −4 can be associated with the groups of values stored in storage portions 800' to 807', respectively. This enables memory device 200 to individually apply different compensation values for different threshold voltage value ranges associated with the corresponding group of values stored in storage portions 800' to 807'.

FIG. 8 shows compensation unit 825 storing eight compensation values as an example. The number of compensation values can vary. For example, the number of compensation values can be based on the number of threshold voltage value ranges of a memory device, such as memory device 200 of FIG. 2.

Compensation unit 825 in FIG. 8 can include a comparator 831 that can operate to compare the values of information IN with the groups of values stored in each of storage portions 800' to 807' during a read operation. Since the groups of values stored in each of storage portions 800' to 807' are based on corresponding set of values information IN, multiple matches in values can occur between the value of information IN on input 830 and the groups of values stored in each of storage portions 800' to 807' when the value of information IN on input 830 increases during a read operation. Comparator 831 can include components (e.g. inversions (NOT) of exclusive OR gates in FIG. 8) to determine when such matches occur.

Compensation unit 825 can include a combiner 832 (e.g., an adder or other logic components) that can operate during a read operation to record the occurrences of the matches (performed by comparator 831) and provide the match results to a group identifier 833. For example, each time a match occurs, combiner 832 can increase a value that it uses to identify which of the groups of values in storage portions 800' to 807' causes a match to occur.

Group identifier 833 can operate to store a value (e.g., group identification) to identify the groups of values in storage portions 800' to 807'. Group identifier 833 can include storage elements (e.g., latches, flip flops, or others) to store a value that identifies the groups of values 800' to 807'. For example, if there are eight groups of values stored in eight corresponding storage portions 800' to 807' (associated with eight threshold voltage value ranges), then group identifier 833 can store eight different values. Each of the eight values can be used to identify different groups among the eight groups of values. Based on the value stored in group identifier 833, the combination of signals S0, S1, and S2 (representing three bits) can be appropriately provided with a value (e.g., from 0 to seven) corresponding to the value stored in group identifier 833.

Compensation unit 825 can include a selector (e.g., multiplexer) 834 to select compensation values stored in storage portions 840 to 847 based on the value stored in group identifier 833 (e.g., values signals S0, S1, and S2). Then, selector 834 can provide the selected compensation value to an output 835 as compensation value COMPi.

As described above with referenced to FIG. 2 through FIG. 7, based on the value of compensation value COMPi (e.g., 0, +1, −2, −4, 0, +3, +2, and −4), a memory device such as memory device 200 of FIG. 2, can correctly select a code to represent a value of information retrieved from memory cell during a read operation.

Figure 9:
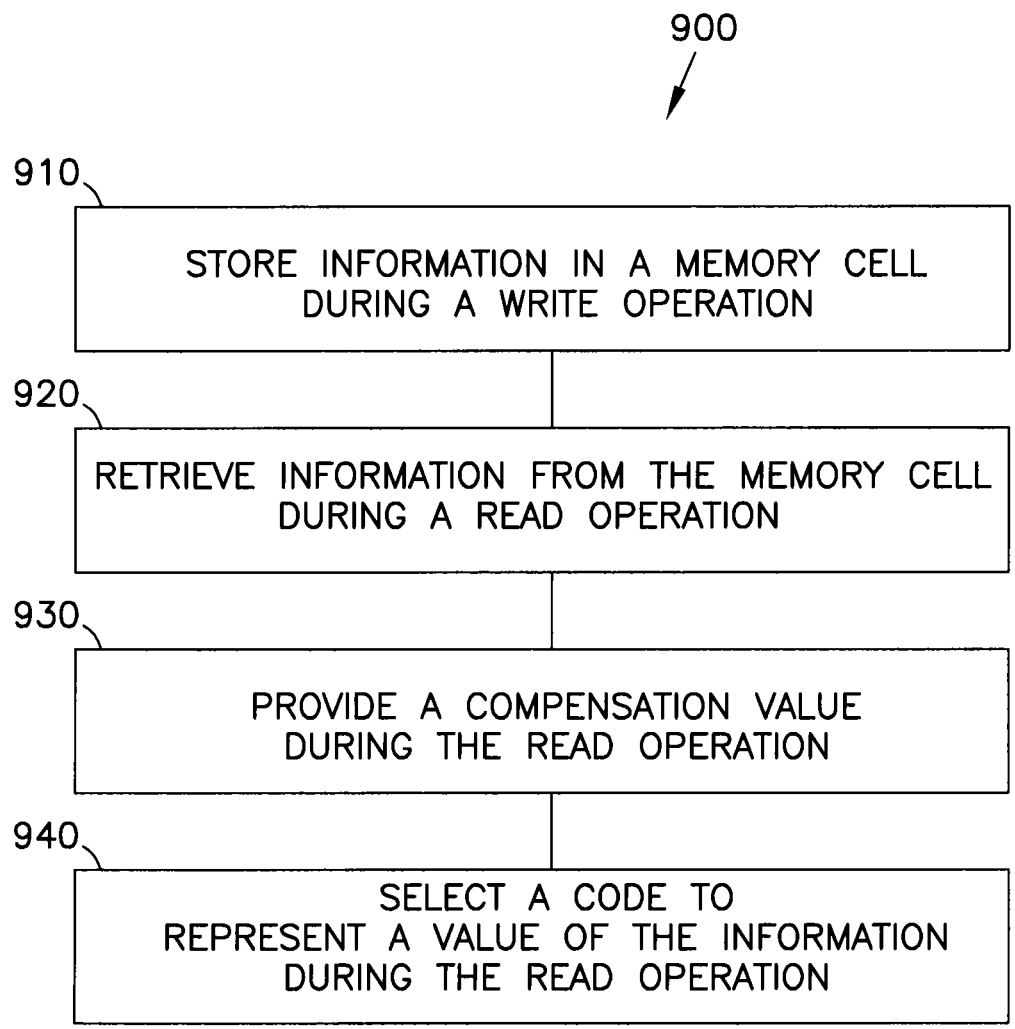
FIG. 9 is a flow diagram showing a method including activities in write and read operations, according to an embodiment of the invention.

FIG. 9 is a flow diagram showing a method 900 including activities in write and read operations, according to an embodiment of the invention. Method 900 can be performed by a memory device, such as memory device 100 (FIG. 1) or memory device 200 (FIG. 2). Thus, information and values used in method 900 can be similar to or identical to those described above with reference to FIG. 1 through FIG. 8.

Activity 910 of method 900 can include storing information in a memory cell of the memory device during a write operation. The information in the write operation can have a value corresponding to a threshold voltage value of the memory cell.

Activity 920 of method 900 can include retrieving information from the memory cell of the memory device during a read operation. The information in the read operation can have a threshold voltage value different from (e.g., greater than or less than) the threshold voltage value associated with the information in the write operation. For example, the threshold voltage value associated with the information in the write operation activity 910 can be threshold voltage value $Vt_{3B}$ (FIG. 6). The threshold voltage value associated with the information in the read operation activity 920 can be threshold voltage value $Vt_{3B'}$ (FIG. 6), which is greater than threshold voltage value $Vt_{3B'}$ in the write operation in activity 910. In another example, the threshold voltage value associated with the information in the write operation activity 910 can be threshold voltage value $Vt_{5A}$ (FIG. 6). The threshold voltage value associated with the information in the read operation activity 920 can be threshold voltage value $Vt_{5A'}$ (FIG. 6), which is less than threshold voltage value $Vt_{5A}$ in the write operation in activity 910.

Activity 930 of method 900 can include providing a compensation value during a read operation (e.g., performed in activity 920) to compensate for any changes in the threshold voltage value of the memory cell after the information is stored in the memory cell. The compensation value can be similar to or identical to one of the compensation values of compensation information $COMP_0$ to $COMP_M$, described above with reference to FIG. 2 through FIG. 8.

Activity 940 of method 900 can include selecting a code during the read operation to represent the original value of information stored in the memory cell in the write operation. The code can have a code value based at least in part on the compensation value, such that the code value can correctly represent the original value of information. The code value can be similar to or identical to the code values of codes $CODE_0$ to $CODE_N$, described above with reference to FIG. 2 through FIG. 8.

Method 900 can include additional activities and operations described above with reference to FIG. 2 through FIG. 8.

The apparatuses and methods of various embodiments described herein may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 9 can include a compensation unit to provide a compensation value based at least in part on a threshold voltage value of a memory cell. At least one of such embodiments includes a controller to select a code during an operation of retrieving information from the memory cell to represent a value of information stored in the memory cell. Such a code can be associated with an address having an address value based at least in part on the compensation value. Other embodiments including additional memory devices and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   an input to receive digital information having a first set of values associated with a first threshold voltage value range of a memory cell and a second set of values associated with a second threshold voltage value range of the memory cell;
   a first storage component to store a first group of values based on a third set of values of the digital information, and to store a second group of values based on a fourth set of values of the digital information; and
   a second storage component to store a first compensation value based on a difference between a first value in the first set of values and a second value in the third set of values, and to store a second compensation value based on a difference between a third value in the second set of values and a fourth value in the fourth set of values.

2. The apparatus of claim 1, wherein the first group of values and the third set of values include a same number of values.

3. The apparatus of claim 2, wherein the second group of values and the fourth set of values include a same number of values.

4. The apparatus of claim 1, wherein the first group of values are in a consecutive order.

5. The apparatus of claim 2, wherein the second group of values are in a consecutive order.

6. The apparatus of claim 5, wherein values from the first group of values to values from the second group of values are in a nonconsecutive order.

7. The apparatus of claim 1, wherein the third set of values of the digital information is associated with a threshold voltage value range of the memory cell.

8. The apparatus of claim 1, further comprising a controller to select a code during an operation of retrieving information from the memory cell to represent a value of information stored in the memory cell, the code associated with an address having an address value based at least in part on the first compensation value.

9. The apparatus of claim 1, further comprising a comparator to compare values of the digital information with the first and second groups of values.

10. The apparatus of claim 1, wherein the first and second storage components include non-volatile memory.

11. The apparatus of claim 1, wherein the first compensation value is different from the second compensation value.

12. The apparatus of claim 1, wherein the first compensation value is equal to the second compensation value.

13. An apparatus comprising:
a memory cell; and
a controller to:
obtain a threshold voltage value of the memory cell during an operation of retrieving information from the memory cell;
provide a compensation value based on a relationship between the threshold voltage value and a threshold voltage value range of the memory cell; and
select a code to represent a value of the information, the code stored at a location associated with an address having and address value based at least in part on the compensation value.

14. The apparatus of claim 13, wherein the controller is to store the information in the memory cell in a write operation performed before the operation of retrieving information from the memory cell, and the threshold voltage value of the memory cell during the operation of retrieving information from the memory cell is different from a threshold voltage value associated with the information in the write operation.

15. A method comprising:
obtaining a threshold voltage value of a memory cell during an operation of retrieving information from the memory cell;
providing a first compensation value if the threshold voltage value is associated with a first threshold voltage value range of the memory cell;
providing a second compensation value if the threshold voltage value is associated with a second threshold voltage value range of the memory cell; and
selecting a code to represent a value of the information, the code stored at a location associated with an address having and address value based at least in part on one of the first and second compensation values.

16. The method of claim 15, wherein at least one of the first and second compensation values is a positive value.

17. The method of claim 15, wherein at least one of the first and second compensation values is a negative value.

18. The method of claim 15, wherein the first compensation value is zero.

19. The method of claim 15, further comprising:
storing the information in the memory cell in a write operation performed before the operation of retrieving information from the memory cell, wherein the threshold voltage value of the memory cell during the operation of retrieving information from the memory cell is different from a threshold voltage value associated with the information in the write operation.

20. The method of claim 19, wherein the threshold voltage value of the memory cell during the operation of retrieving information from the memory cell is greater than the threshold voltage value associated with the information in the write operation.

21. The method of claim 19, wherein the threshold voltage value of the memory cell during the operation of retrieving information from the memory cell is less than the threshold voltage value associated with the information in the write operation.

* * * * *